(12) United States Patent
Gabillard et al.

(10) Patent No.: US 6,946,986 B2
(45) Date of Patent: Sep. 20, 2005

(54) DIFFERENTIAL SAMPLING CIRCUIT FOR GENERATING A DIFFERENTIAL INPUT SIGNAL DC OFFSET

(75) Inventors: Bertrand Gabillard, Paris (FR); Alexandre Maltere, Montgero (FR); Philippe Hauviller, Itteville (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/738,347

(22) Filed: Dec. 17, 2003

(65) Prior Publication Data
US 2004/0130468 A1 Jul. 8, 2004

(30) Foreign Application Priority Data
Dec. 19, 2002 (EP) .............................. 02368141

(51) Int. Cl.[7] .............................................. H03M 7/00
(52) U.S. Cl. ........................................ 341/150; 341/172
(58) Field of Search .................................. 341/150, 172, 341/143, 118, 120

(56) References Cited

U.S. PATENT DOCUMENTS

| | | | | |
|---|---|---|---|---|
| 5,057,839 A | * | 10/1991 | Koch | 341/143 |
| 5,140,325 A | * | 8/1992 | Yu et al. | 341/143 |
| 5,389,928 A | * | 2/1995 | Coppero et al. | 341/150 |
| 5,514,999 A | * | 5/1996 | Koifman et al. | 330/9 |
| 5,739,720 A | * | 4/1998 | Lee | 330/9 |
| 6,169,427 B1 | * | 1/2001 | Brandt | 327/94 |

* cited by examiner

*Primary Examiner*—John B Nguyen
(74) *Attorney, Agent, or Firm*—Jay H. Anderson

(57) ABSTRACT

A differential sampling circuit is configured around a differential operational amplifier and is provided with a pair of switched-capacitor networks, each including an circuit block, to generate the real value of the differential input signal DC offset at each system clock cycle. During the first half cycle, the differential input signal pair (Vin+,Vin−) is sampled and the holding capacitors in each network are charged. During the second half cycle, the differential input signal pair is sampled again and the holding capacitors are further charged. At the end of the cycle, the charges held in the holding capacitors are applied to the differential operational amplifier, so that the differential output signal is equal to the real differential input signal DC offset value.

6 Claims, 4 Drawing Sheets

US 6,946,986 B2

DIFFERENTIAL SAMPLING CIRCUIT FOR GENERATING A DIFFERENTIAL INPUT SIGNAL DC OFFSET

FIELD OF THE INVENTION

The present invention relates to analog circuits and more particularly to an improved differential sampling circuit based on a switched-capacitor approach that directly generates the real differential signal DC offset value.

BACKGROUND OF THE INVENTION

With the continuous frequency increase of signals used in modern communication links, unwanted effects such as cross talk, false ringing, parasitic reflection, offsets occur more and more often due to the distributed nature of the media which transports these signals. In the particular case of coupled lines, a major contributor is the differential input DC offset which is the result of different amplitudes and common modes on each of the lines. For instance, according to the SCSI standard for hard-disk applications (SPI4) effective to date, data are transported at 80 MHz (frequency of the system clock). At this speed, the data integrity on the bus is high enough so as to generally not require any offset cancellation technique. On the contrary, according to the next SCSI standard to be implemented in the future (SPI5), data will be transported at 160 MHz. At such a high speed, compensation of the differential input signal DC offset becomes necessary. This differential input signal DC offset is sampled and stored in a capacitor; an analog to digital converter (ADC) then converts this value to binary digits and stores it in a register latch.

FIG. 1 illustrates the definition of the differential input signal DC offset. As shown in FIG. 1, the amplitudes and common modes of a differential signal VP-VN are different between the first half and the second half of the period T of the system clock. The differential input signal DC offset is defined as being equal to the half sum of the differential amplitude $\Delta V1$ in the first half period and the differential amplitude $\Delta V2$ in the second half period. The differential input signal DC offset $\Delta V$offset is given by: $0.5*[(VP1+VP2)-(VN2+VN1)]=0.5*[(VP\ 1-VN1)+(VP2-VN2)]=0.5*[\Delta V1+\Delta V2]$. This calculation can be performed by a sampling circuit which samples the differential input signal twice within a clock cycle and has a gain of ½.

The conventional differential input signal sampling circuit disclosed in "A ratio-independent algorithmic analog-to-digital conversion technique" (IEEE JSSC, vol 19, pp 828–836, December 1984) by P. W. Li, M. J. Chin, P. R. Gray, and R. Castello is of interest in some respects. It is constructed around a differential operational amplifier (opamp) provided with a switched-capacitor network in order to sample twice the differential input signal in four phases to generate $2*\Delta V$, if the input signal keeps its value at times of sampling, or $[\Delta V1+\Delta V2]$ if not. However, it does not aim to calculate the differential input signal DC offset, and its gain is independent of both the opamp DC offset and the capacitor values which is a determining advantage.

FIG. 2 shows the single-ended version (simplified diagram) of this conventional differential input signal sampling circuit 20, which samples twice the input signal Vin, to generate a signal Vout=Vin+Vin=2*Vin, if input signal Vin remains unchanged during the sampling operations. The single ended version has been chosen in lieu of the differential one for the sake of simplicity of the description. Circuit 20 is organized around an operational amplifier (opamp) 21 and a switched-capacitor network comprising two capacitors C1, C2 and six switches S1–S6 connected as shown in FIG. 2. The positive input of the opamp 21 is coupled to ground. A first capacitor C1, usually referred to as the holding capacitor, is coupled to its negative input and a first node 22. A first switch S1 is coupled between first node 22 and the input signal Vin. A second switch S2 is coupled to first node 22 and ground. A second capacitor C2 is coupled between a second node 23 and the opamp 21 negative input. A third switch S3 is coupled between this negative input and the output of opamp 21. A fourth switch S4 is coupled to second node 23 and the output. A fifth switch S5 is coupled between second node 23 and ground. Finally, a sixth switch S6 is coupled to first node 22 and the output in a feedback loop. Output signal Vout that is generated by circuit 20 is independent of the opamp 21 DC offset Voff and also independent of the value of capacitors C1 and C2. Operation of circuit 20 will be described by reference to FIGS. 3a–3d. In successive drawings, the status of switches S1-S6 changes. They can be opened or closed according to the application algorithm.

Full operation of circuit 20 requires four phases: two input signal sampling and two charge transfers. Considering FIG. 3a, let us assume the input signal to be sampled Vin is equal to V1. It is easy to calculate voltage Vc1 across capacitor C1, voltage Vc2 across capacitor C2 and output voltage Vout. At the end of the first input signal sampling, we have:

$$Vc1=V-Voff$$

$$Vc2=-Voff$$

$$Vout=Voff$$

The charge Q1 stored into capacitor C1 is equal to $C1*(V1-Voff)$.

After the first sampling, the first charge transfer is performed using the configuration shown in FIG. 3b. The charge variation $DQ1=C1*V1$ is transferred to capacitor C2. We then have:

$$Vc1=-Voff$$

$$Vc2=-Voff+V1*C1/C2$$

$$Vout=V1*C1/C2$$

The first sampling and the first charge transfer described above by reference to FIGS. 3a–3b are performed during the first half period of the system clock.

Next, the second input signal sampling is performed using the configuration depicted in FIG. 3c. After the second input sampling, we assume that Vin has changed and is now equal to V2. We have:

$$Vc1=V2-Voff$$

$$Vc2=-Voff+V1*C1/C2\ (Vc2\ \text{remains unchanged})$$

$$Vout=Voff$$

Finally, the second charge transfer is performed using the configuration shown in FIG. 3d. At the end of this step, the charge Q2 stored on C2 is transferred to capacitor C1 so that we have:

$Vc2 = -Voff$ $DQ2 = V1*C1$ $Vc1 = V2 - Voff + DQ2/C1 = V2 - Voff + V*C1/C1 = V1 + V2 - Voff$ $Vout = Voff + Vc1 = V1 + V2$ The second sampling and the second charge transfer described above by reference to FIGS. 3c–3d are performed during the second half period of the system clock. The operations described above by reference to FIGS. 3a–d are thus performed at each system clock cycle.

Consequently, using circuit 20, Vout equals the sum of the two sampled input values V1 and V2. It is to be noted that Vout is independent of both the opamp 21 DC offset Voff and the values of capacitors C1 and C2, which is beneficial. However, should we consider the differential version of circuit 20 applied to the calculation of the differential DC offset ΔVoffset, it would generate a differential voltage equal to [ΔV1+ΔV2], so that it would have the inconvenience of requiring a ½ gain opamp connected in series at its outputs before obtaining the differential offset value which is equal to 0.5*[ΔV1+ΔV2].

SUMMARY OF THE INVENTION

According to the present invention there is described an improved differential sampling circuit based on a switched-capacitor network approach that directly generates the real differential input signal DC offset value. It is configured around a differential operational amplifier and is provided with a pair of switched-capacitor networks, each including an innovative block to generate the real value of the differential input signal DC offset at each system clock cycle. During the first half cycle, the differential input signal pair is sampled and the holding capacitors in each network are charged. During the second half cycle, the differential input signal pair is sampled again and the holding capacitors are further charged. At the end of the cycle, the charges held in the holding capacitors are applied to the differential operational amplifier, so that the differential output signal that is output therefrom is equal to the real differential input signal DC offset value.

It is therefore a primary object of the present invention to provide an improved differential sampling circuit based on a switched-capacitor network approach that directly generates the real differential input signal DC offset value.

It is another object of the present invention to provide an improved differential sampling circuit configured around a differential operational amplifier and a pair of switched-capacitor network wherein the differential input signal DC offset value is independent of the differential operational amplifier DC offset.

It is still another object of the present invention to provide an improved differential sampling circuit based on a switched-capacitor network approach that directly generates the differential input signal DC offset value with a high accuracy to meet the SCSI-PI5 specifications.

In accordance with the present invention, a differential sampling circuit is provided for generating a real differential input signal DC offset value at each period of a system clock. The circuit includes a differential operational amplifier and two capacitors. The operational amplifier has an input terminal and an output terminal, and is characterized by a DC offset voltage; the capacitors each have a first terminal connected to the input terminal, and are matched with respect to capacitance value. During an input signal sampling operation in a portion of each system clock period, the charge on the first capacitor is proportional to the DC offset voltage, and the first capacitor and the second capacitor are connected in parallel during a charge transfer operation in a subsequent portion of each system clock period. The output terminal voltage during the charge transfer operation is proportional to a sum of a first input voltage applied to the input terminal during the first signal sampling operation and a second input voltage applied to the input terminal during a second signal sampling operation in another portion of the system clock period; this output terminal voltage is independent of the DC offset voltage.

DETAILED DESCRIPTION OF PREFERRED EMBODIMENTS

Figure 1:
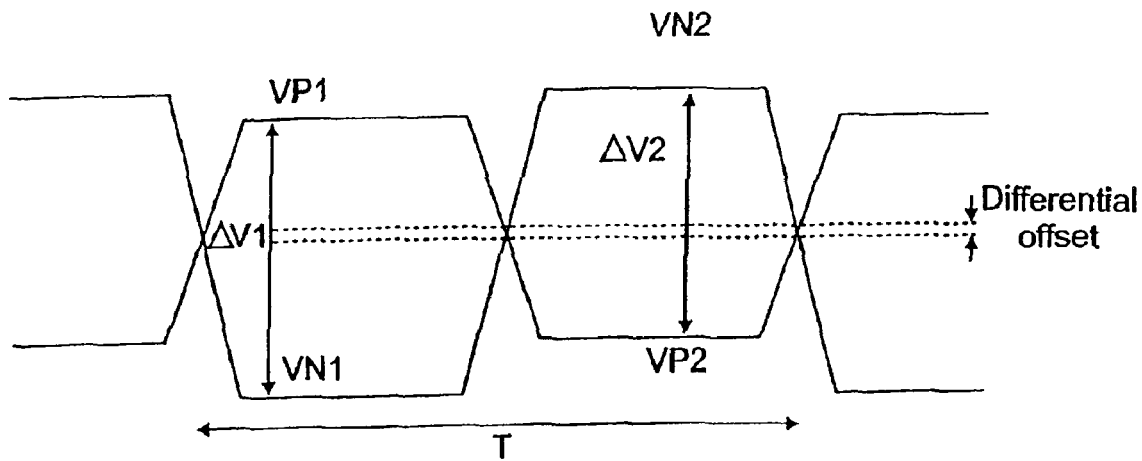
FIG. 1 illustrates the general definition of the differential input signal DC offset.

Like reference numerals (with prime) are used in the drawings to designate identical (corresponding) parts. For the sake of illustration, the circuit 20 shown in FIG. 2, will be first modified to generate 0.5*(V1+V2) instead of (V1+V2) according to the present invention.

Figure 2:
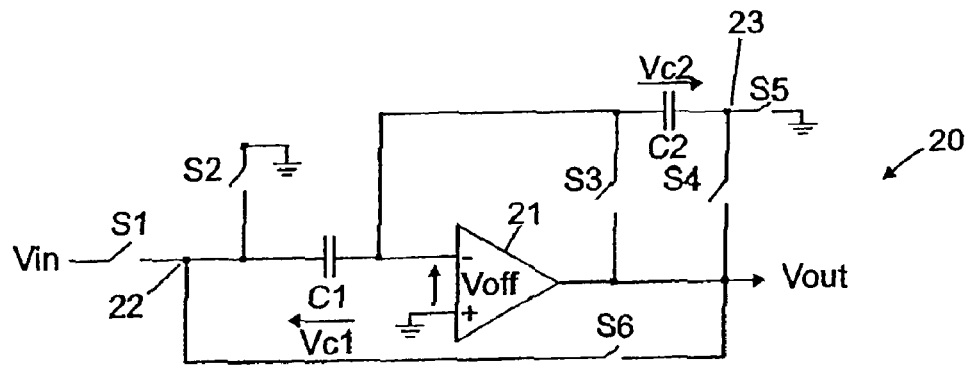
FIG. 2 is a schematic diagram of a conventional single-ended input signal sampling circuit.
Figure 4:
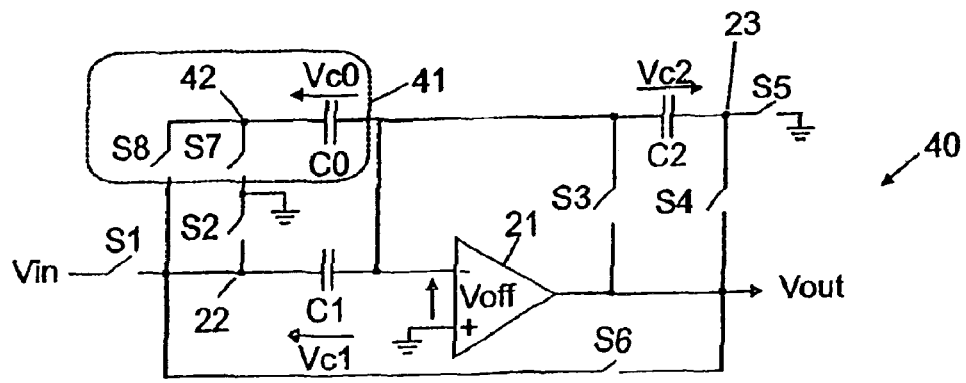
FIG. 4 shows a single-ended input signal sampling circuit in accordance with an embodiment of the present invention.
Figure 3A:
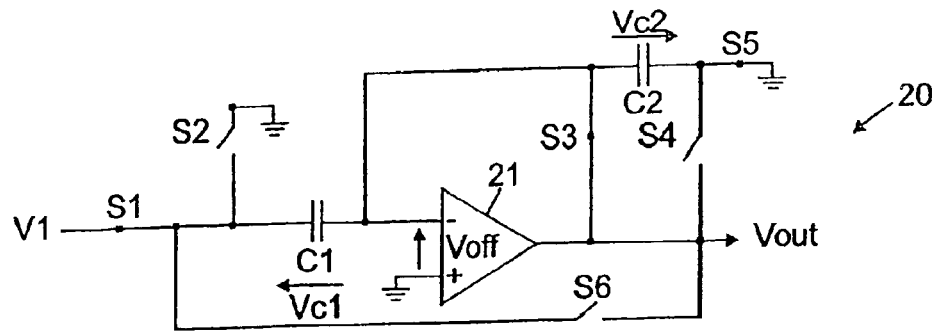
FIGS. 3a–d shows different configurations of the circuit of FIG. 2, to illustrate four operational phases of that circuit respectively.
Figure 3B:
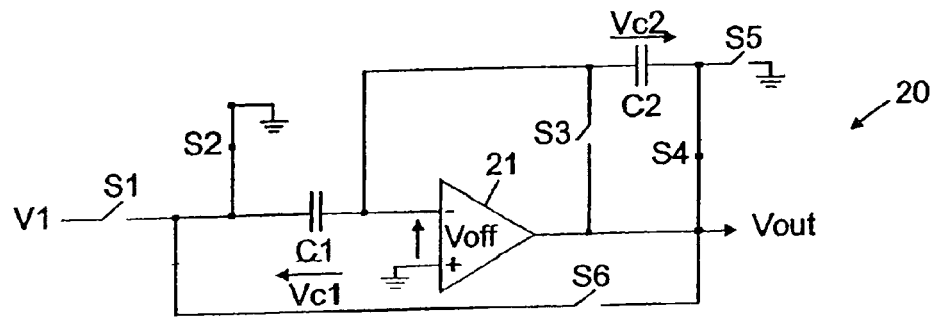
Figure 3C:
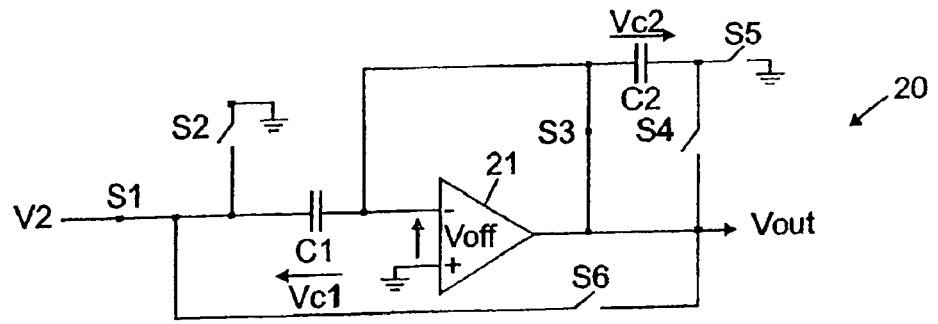
Figure 3D:
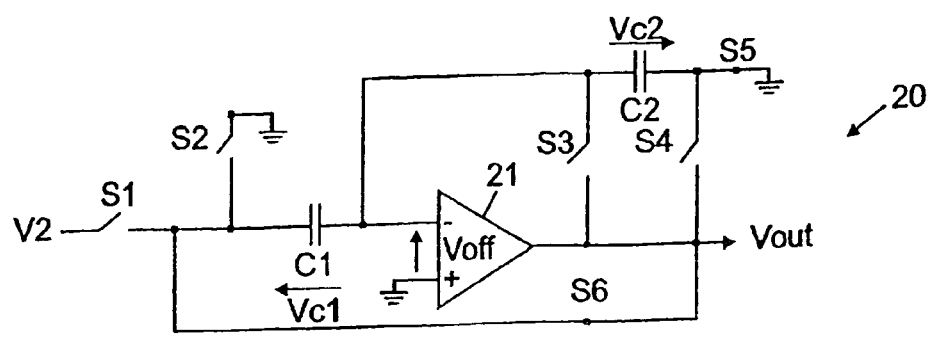

As apparent from FIG. 4, where a circuit embodying the invention is referenced 40, the circuit of FIG. 2 has been modified to add circuit block 41. Circuit block 41 comprises one extra capacitor C0 and two extra switches S7 and S8. Capacitor C0 is coupled to the opamp 21 negative input and to a third node 42. Switch S7 is coupled to second node 42 and ground. Switch S8 is connected between the first and third nodes.

The operation of circuit 40 is still based upon four operational phases that will be now described with reference to FIGS. 5a–5d; these phases are performed at each system clock cycle.

Figure 5A:
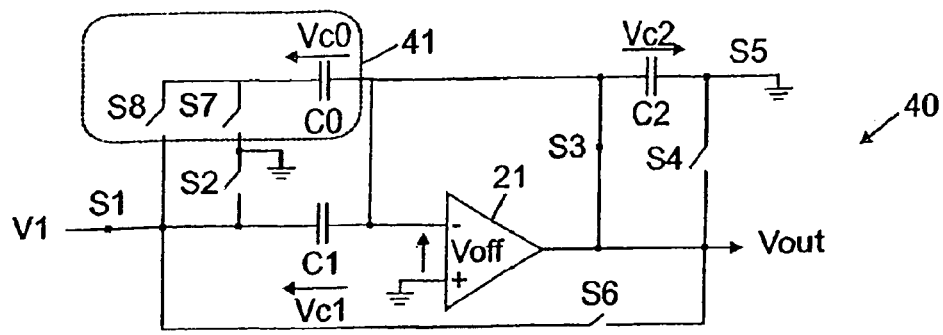
FIGS. 5a–d show different configurations of the FIG. 4 circuit to illustrate four operational phases thereof.

Let us consider FIG. 5a which illustrates the first input signal sampling. It may still be assumed that Vin=V1. When V1 is sampled, the capacitor C0 is floating as switches S7 and S8 are open. Switches S2, S4 and S6 are open while switches S1, S3 and S5 are closed. After the first input signal sampling, we have:

$Vc1 = V1 - Voff$ $Vc2 = -Voff$ $Vout = Voff$

The charge Q1 stored into holding capacitor C1 is equal to $C1*(V1-Voff)$.

Figure 5B:
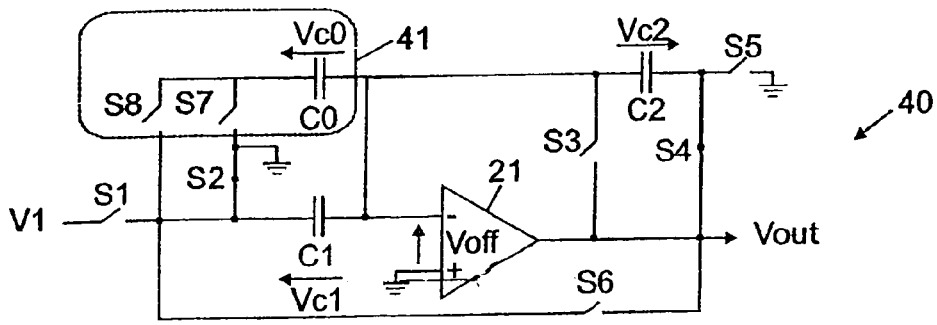

FIG. 5b illustrates the configuration of circuit 40 during the first charge transfer when switches S1, S3 and S5 are opened and switches S2 and S4 are closed. During this phase, the charge variation DQ1, equal to C1*V1, is transferred into capacitor C2, so that:

$Vc1=-Voff$ $Vc2=-Voff+V1*C1/C2$ $Vout=V1*C1/C2$

Figure 5C:
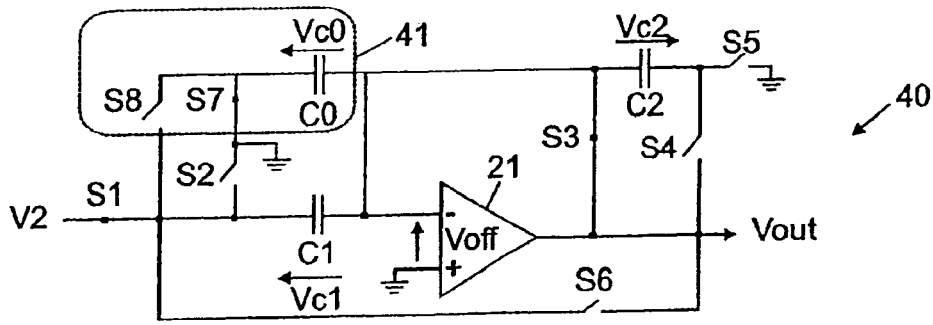
Figure 5D:
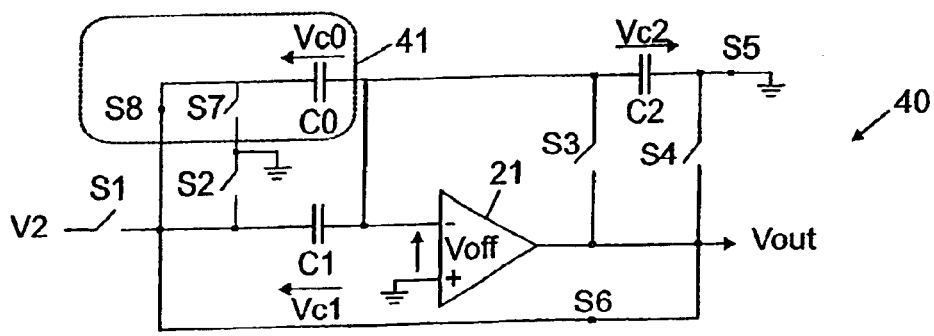

During the second input sampling, switches S1, S3 and S7 are closed and switches S2 and S4 are opened, circuit 40 then has the configuration depicted in FIG. 5c. Let us assume now that Vin has changed and equals V2. The capacitor C0 is connected to ground because switch S7 is closed, so that:

$Vc0=-Voff$ $Vc1=V2-Voff$ $Q1=C1*(V2-Voff)$ $Vc2=-Voff+V1*C1/C2$ (Vc2 remains unchanged)

$Vout=Voff$

The charge Q0 stored into capacitor C0 is equal to −C0*Voff. This is an important feature of the present invention as will be discussed in more detail below. The charge stored in capacitor C2 is equal to V1*C1−C2*Voff.

Finally, during the second charge transfer (see FIG. 5d), switches S1, S3 and S7 are opened while switches S5, S6 and S8 are closed. The capacitor C0 is put in parallel with capacitor C1 because switch S8 is closed. Then:

$Vc2=-Voff$ $Q2=-Voff*C2$ $Vc0=Vc1=(Q0+Q1)/(C0+C1)=(C1*V2-Voff(C0+C1))/(C0+C1)=V2* C1/(C0+C1)-Voff$ There is a charge transfer equal to the charge variation DQ2 to capacitors C0 and C1. Consequently, the voltages Vc0 and Vc1 change as follows:

$DQ2=C1*V1$ $Vc0=Vc1=(DQ2+Q0+Q1)/(C0+C1)=C1*V1/(C0+C1)+V2*C1/(C0+C1)-Voff$ $Vc0=Vc1=(V1+V2)/(1+C0/C1)-Voff$, and finally $Vout=Vc0+Voff=(V1+V2)/(1+C0/C1)$.

Because Q0=−C0*Voff is present in the calculation of Vc0, the opamp 21 DC offset Voff does not appear in Vout. As a result, the signal output from circuit 40 is still independent of the opamp 21 offset, and is independent of the value of capacitor C2 as well. It is noteworthy that, if C0=C1, i.e. if there is a perfect matching between these capacitors, then Vout=0.5*(V1+V2); otherwise, the error on Vout is divided by two. For instance, if the mismatch between C0 and C1 is equal to about 2%, the error on Vout will be only about 1%. Only the ratio C0/C1 of capacitor values must be as close as possible to 1. An improved differential sampling circuit embodying the present invention and derived from circuit 40, for generating the real differential input signal DC offset, embodying the present invention, will be now described in detail.

Figure 6:
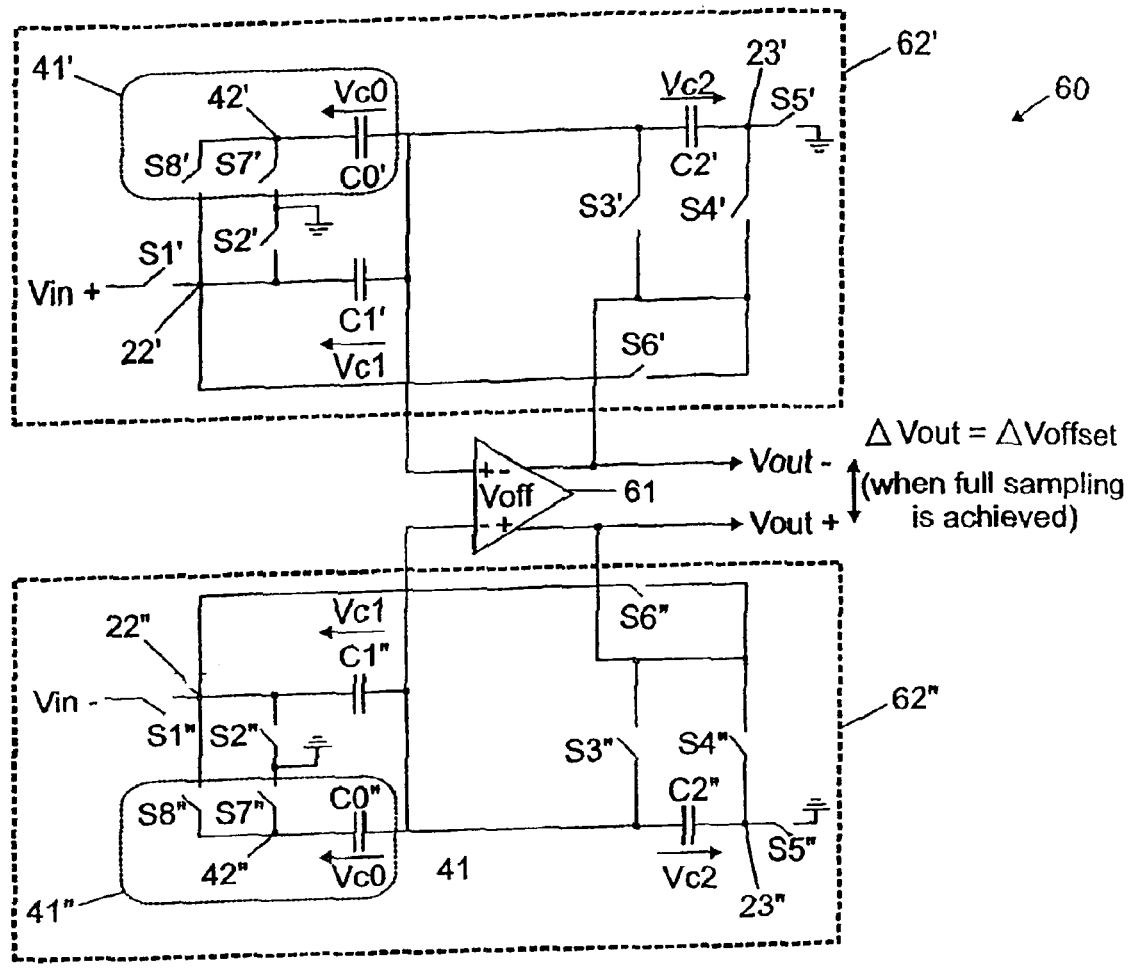
FIG. 6 is a schematic diagram of a differential sampling circuit embodying the present invention and derived from the circuit of FIG. 4, for generating the real differential input signal DC offset value.

Circuit 60, shown in FIG. 6, may be viewed as a combination of two identical circuits 40 driven by first and second input signals Vin+ and Vin− respectively. However, in the embodiment of the present invention shown in FIG. 6, the two opamps have been merged in a single differential opamp referenced 61, having thus two inputs and two outputs, for greater optimization. As apparent in FIG. 6, the upper switched-capacitor network 62', which includes circuit block 41', is connected between the positive input and the negative output. Likewise, the lower switched-capacitor network 62", which includes block 41", is connected between the negative input and the positive output. In the upper network, the extra devices are referenced C0', S7' and S8'. In the lower network, the extra devices are referenced C0", S7" and S8". It is highly desirable that the corresponding components in the upper and lower networks be matched. The input signals applied to circuit 60, forming the differential input signal pair, are labeled Vin+ and Vin−. Corresponding output signals are labeled Vout− and Vout+ respectively, defining a differential output signal ΔVout therebetween. By construction, this differential output signal ΔVout that is generated by circuit 60 is equal to the differential input signal DC offset ΔVoffset, as soon as the four operational phases have been completed. Vout−=0.5*[(Vin+1)+(Vin+2)], Vout+=0.5*[(Vin−1)+(Vin−2)] using the calculations and the notations given above for the improved circuit 40 described by reference to FIGS. 4 and 5a–d, so that ΔVout=(Vout−)−(Vout+)=ΔVoffset=0.5*[ΔV1+ΔV2], wherein ΔV1=[(Vin+1)−(Vin−1)] and +ΔV2=[(Vin+2)+(Vin−2)], i.e. to the half sum of the two sampled differential input signal values.

Simulations have demonstrated that it is possible to measure the real value of the differential input signal DC offset and then to meet the SCSI-PI5 specifications.

The advantages of the invention are as follows: The differential input signal DC offset value is measured during only one system clock period. The DC offset is independent of the differential opamp 61 DC offset and the values of capacitors. Only the capacitor value ratio C0/C1 should be equal to 1; a mismatch in this ratio of x % would lead to an error of x/2% in the measured DC offset value.

While the invention has been particularly described with respect to a preferred embodiment thereof, it should be understood by one skilled in the art that the foregoing and other changes in form and details may be made therein without departing from the spirit and scope of the invention.

We claim:

1. A differential sampling circuit employing a switched-capacitor approach for generating a real differential input signal DC offset value at each period of a system clock, the circuit having first and second input signals (Vin+,Vin−) input thereto, the circuit comprising:

a differential operational amplifier having a positive input and a negative input, the positive output generating a first output signal Vout+ and the negative output generating a second output signal Vout− defining a differential output signal ΔVout therebetween;

a first switched-capacitor network including
      a first capacitor coupled to said positive input and to a first node,
      a first switch coupled to said first node and to a first terminal supplying the first input signal (Vin+),
      a second switch coupled to said first node and to ground,
      a third switch coupled to said positive input and to said negative output,
      a fourth switch coupled to said negative output and to a second node,
      a fifth switch coupled to said second node and to ground;

a second capacitor coupled to said positive input and to the second node, a sixth switch coupled to said first node and to the negative output, a third capacitor coupled to said positive input and to a third node, a seventh switch coupled to said third node and to ground, and an eighth switch coupled to said first node and to said third node;

a second switched-capacitor network including a fourth capacitor coupled to said negative input and to a fourth node, a ninth switch coupled to said fourth node and to a second terminal supplying the second input signal (Vin−), a tenth switch coupled to said fourth node and to ground, an eleventh switch coupled to said negative input and to said positive output, a twelfth switch coupled to said positive output and to a fifth node, a thirteenth switch coupled to said fifth node and to ground, a fifth capacitor coupled to said negative input and to the fifth node, a fourteenth switch coupled to said fourth node and to said positive output, a sixth capacitor coupled to said negative input and to a sixth node, a fifteenth switch coupled to said sixth node and to ground, and a sixteenth switch coupled to said fourth node and to said sixth node;

wherein said first capacitor and said third capacitor have equal values, said fourth capacitor and said sixth capacitor have equal values, and said switches are selectively set in response to control signals in either an open or a closed state according to a determined algorithm within one period of said system clock.

2. The sampling circuit of claim 1 wherein said control signals are generated by timing control means receiving the system clock.

3. The sampling circuit of claim 1 wherein the first, ninth, third, eleventh, fifth, and thirteenth switches are closed while the second, tenth, fourth, twelfth, sixth, fourteenth, seventh, fifteenth, eighth and sixteenth switches are open during at least a first portion of the first half period.

4. The sampling circuit of claim 1 wherein the second, tenth, fourth, and twelfth switches are closed while the first, ninth, third, eleventh, fifth, thirteenth, sixth, fourteenth, seventh, fifteenth, eighth and sixteenth switches are open during at least a second portion of the first half period.

5. The sampling circuit of claim 1 wherein the first, ninth, third, eleventh, seventh, and fifteenth switches are closed while the second, tenth, fourth, twelfth, fifth, thirteenth, sixth, fourteenth, eighth and sixteenth switches are open during at least a first portion of the second half period.

6. The sampling circuit of claim 1 wherein the fifth, thirteenth, sixth, fourteenth, eighth, and sixteenth switches are closed while the first, ninth, second, tenth, third, eleventh, fourth, twelfth, seventh and fifteenth switches are open during at least a second portion of the second half period.

* * * * *